(12) United States Patent
Urdaneta

(10) Patent No.: US 10,597,981 B2
(45) Date of Patent: Mar. 24, 2020

(54) DRILLING ENGINEERING ANALYSIS ROADMAP BUILDER FOR HYDROCARBON RESERVOIR MODELING

(71) Applicant: Landmark Graphics Corporation, Houston, TX (US)

(72) Inventor: Gustavo A. Urdaneta, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 333 days.

(21) Appl. No.: 15/025,861

(22) PCT Filed: Oct. 25, 2013

(86) PCT No.: PCT/US2013/066961
§ 371 (c)(1),
(2) Date: Mar. 29, 2016

(87) PCT Pub. No.: WO2015/060879
PCT Pub. Date: Apr. 30, 2015

(65) Prior Publication Data
US 2016/0230514 A1  Aug. 11, 2016

(51) Int. Cl.
*E21B 41/00* (2006.01)
*E21B 7/00* (2006.01)
(Continued)

(52) U.S. Cl.
CPC ............ *E21B 41/0092* (2013.01); *E21B 7/00* (2013.01); *E21B 41/00* (2013.01); *G06F 17/10* (2013.01); *G01V 1/40* (2013.01)

(58) Field of Classification Search
CPC .. G06F 3/04855; G06F 17/5009; E21B 47/06; E21B 7/00; E21B 44/00
See application file for complete search history.

(56) References Cited

U.S. PATENT DOCUMENTS 6,785,641 B1  8/2004  Huang
6,950,786 B1  9/2005  Sonneland et al.
(Continued)

FOREIGN PATENT DOCUMENTS

WO  WO-2004053659 A3  6/2004

OTHER PUBLICATIONS

International Search Report and Written Opinion, dated May 2, 2014, 25 pages, Mail Stop PCT ISA/US, United States.
(Continued)

*Primary Examiner* — Kandasamy Thangavelu

(57) ABSTRACT

Methods, systems, and computer program products for developing and presenting wellbore pipe string related operation engineering parameter roadmaps in hydrocarbon reservoir modeling are disclosed. A computer-implemented method may include receiving a plurality of depth intervals, associating different computational model calculations with each depth interval, selecting input parameter values for each set of computational model calculations, generating computational model results for each set of computational model calculations associated with each interval to yield a graphical interval plot for the depth interval; and displaying a plurality of graphical interval plots together on a wellbore roadmap. A control list for the roadmap is correspondingly generated and dynamically linked to the wellbore roadmap so that individual entries in the control list are associated with individual interval plots.

21 Claims, 9 Drawing Sheets

(51) Int. Cl.
*G06F 17/10* (2006.01)
*G01V 1/40* (2006.01)

(56) References Cited

U.S. PATENT DOCUMENTS

| | | |
|---|---|---|
| 7,546,884 B2 | 6/2009 | Veeningen et al. |
| 7,809,508 B2 | 10/2010 | Desport |
| 7,986,319 B2 | 7/2011 | Dommisse et al. |
| 8,214,188 B2 | 7/2012 | Bailey, Jr. et al. |
| 2008/0289875 A1 | 11/2008 | Burge et al. |
| 2010/0191516 A1 | 7/2010 | Benish et al. |
| 2011/0214878 A1* | 9/2011 | Bailey ............... E21B 7/00 166/369 |
| 2012/0274664 A1* | 11/2012 | Fagnou ............ G06F 3/04855 345/660 |
| 2012/0325556 A1* | 12/2012 | Luxey ............... E21B 44/00 175/40 |
| 2013/0090855 A1* | 4/2013 | Rasmus ............. E21B 47/06 702/9 |
| 2013/0275099 A1* | 10/2013 | Frydman ........... G06F 17/5009 703/2 |
| 2015/0012219 A1* | 1/2015 | Selman ............. E21B 47/06 702/9 |

OTHER PUBLICATIONS

Allen, D et al., Oilfield Review, Modeling Logs for Horizontal Well Planning and Evaluation, Winter 1995, 17 pages.

* cited by examiner

DRILLING ENGINEERING ANALYSIS ROADMAP BUILDER FOR HYDROCARBON RESERVOIR MODELING

CROSS-REFERENCE TO RELATED APPLICATIONS

This application is a U.S. national stage patent application of International Patent Application No. PCT/US2013/066961, filed on Oct. 25, 2013, the benefit of which is claimed and the disclosure of which is incorporated herein by reference in its entirety.

FIELD OF THE DISCLOSURE

The present disclosure generally relates to the modeling and analysis of drilling systems in the oil and gas industries, and more particularly, to organizing and facilitating the visualization of modeled operational constraints and set of operational input parameters for different depth intervals.

BACKGROUND

Modeling in the oil and gas industry is important to maximizing return on investment. Such modeling includes the modeling of formations, as well as the modeling of drilling and extraction systems used to recover hydrocarbons from formations. One important aspect of any such model is to understand the effects of changes to various model parameters as depth changes. For example, one might model how a change in drilling mud density might affect the drill string penetration rate at a particular depth. As depth of investigation changes, the most optimum parameters for that particular depth may change. Additionally, or alternatively, the significance of particular parameters may change with depth. In other words, one set of analyses and parameters may be most significant for a first depth, while a different set of analyses and parameters may be most significant for a second depth.

Organizing and visualizing the results of each of the analyses performed for a given depth or hole-section of a modeled well where different operational parameters are applied is difficult and tedious with excessive work load for the end user. One option to avoid such an approach is to select analyses for the entire length of a modeled wellbore and utilize for those analyses equations one set of parameters and parameter values across the entire wellbore. In such case, typically, a user may select the parameter values to simulate the worst case scenario for a wellbore. The resulting visual representation is a single plot along the entire length of the modeled wellbore. Often, this plot may be significantly different at any given depth from a more accurate model of the wellbore.

Another approach is to perform analysis at a plurality of select depth intervals. Typically, a user first must select the different depth intervals for analysis. Then the particular analyses or calculations to be performed at that depth are selected. Next, a set of input values for the equations utilized in the analyses are entered and results are computed. The results of the analyses is then presented in a visual representation that is "frozen" or saved as a "snapshot." The user must then change the input parameter values and repeat the visual representation process. The forgoing will result in a plurality of snapshots for any given depth, leaving the user to keep track of which snap shot corresponds to which particular set of values among the analyses. The most desired snapshot for any given depth may then be selected and compiled into a roadmap for the overall wellbore. In addition to the drawbacks discussed above, such a process requires prolonged iteration time and inhibits updates to the models when performing design changes on the fly.

The complexity of the foregoing procedure increases as other analyses and string operations are performed simultaneously. It is difficult to keep track of different depth ranges, sets of specific parameters for each of the depth intervals, and analyses or operation types.

BRIEF DESCRIPTION OF THE DRAWINGS

Various embodiments of the present disclosure will be understood more fully from the detailed description given below and from the accompanying drawings of various embodiments of the disclosure. In the drawings, like reference numbers may indicate identical or functionally similar elements. The drawing in which an element first appears is generally indicated by the left-most digit in the corresponding reference number.

DETAILED DESCRIPTION

Figure 1:
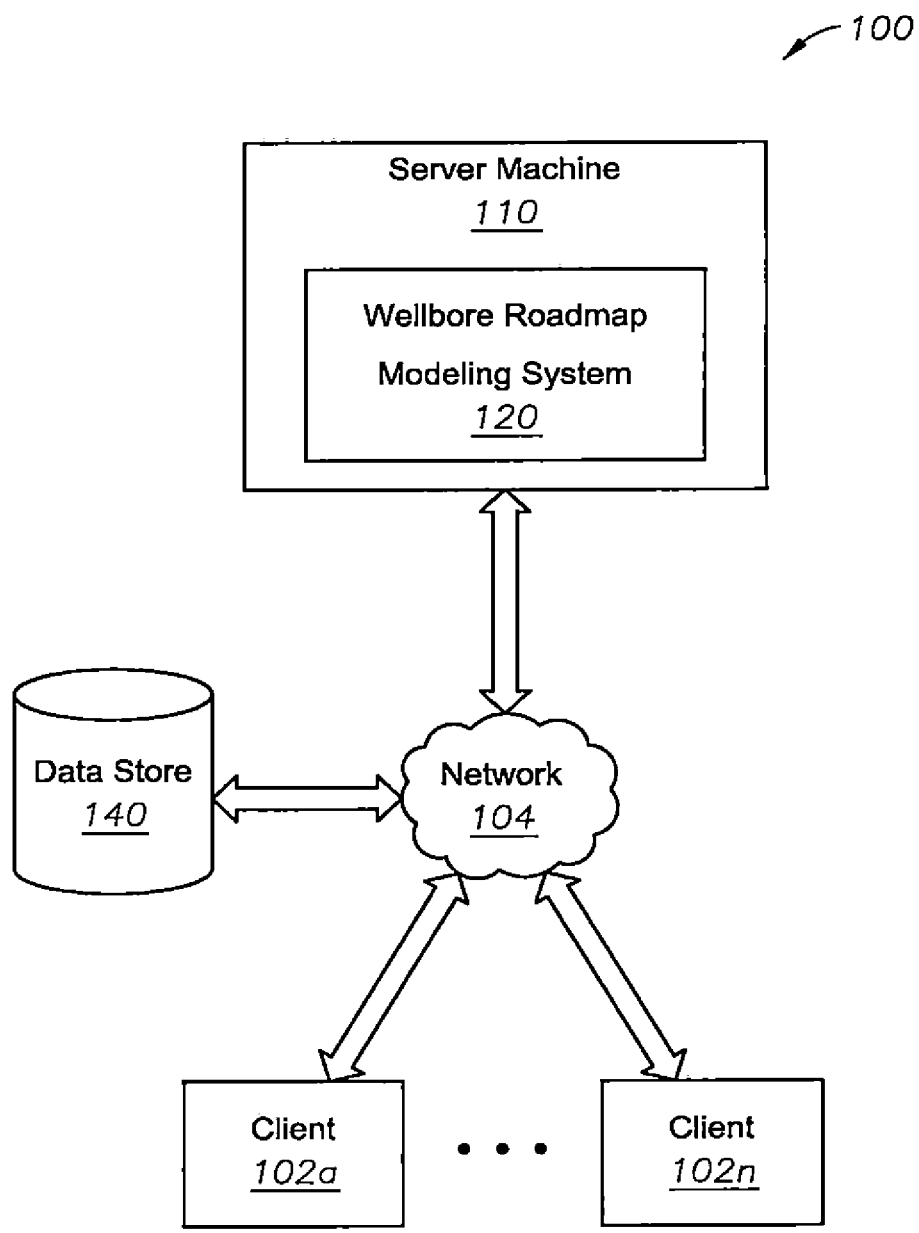
FIG. 1 illustrates a system architecture, in accordance with various embodiments of the present disclosure.

FIG. 1 illustrates system architecture 100 in which embodiments can be implemented. System architecture 100 includes server machine 110, data store 140 and client machines 102A-102N connected to a network 104. Network 104 may be a public network (e.g., the Internet), a private network (e.g., a local area network (LAN), a wide area network (WAN)), or a combination thereof.

Client machines 102A-102N may be personal computers (PC), laptops, mobile phones, tablet computers, or any other computing device. Client machines 102A-102N may run an operating system (OS) that manages hardware and software of the client machines 102A-102N.

Server machine 110 may be a rackmount server, a router computer, a personal computer, a portable digital assistant, a mobile phone, a laptop computer, a tablet computer, a netbook, a desktop computer, a media center, or any combination thereof.

Server machine 110 includes a wellbore roadmap modeling system 120. In some embodiments, wellbore roadmap modeling system 120 may run on one or more different machines. In other embodiments, wellbore roadmap modeling system 120 may run on a single machine.

In general, functions described in embodiments as being performed by server 110 also may be performed on client machines 102A-102N in other embodiments. In addition, the functionality attributed to a particular component can be performed by different or multiple components operating together. Server 110 also can be accessed as a service provided to other systems or devices through appropriate application programming interfaces.

Data store 140 is persistent storage that is capable of storing various types of data (e.g., text, audio, video, images, maps). In some embodiments data store 140 might be a network-attached file server, while in other embodiments data store 140 might be some other type of persistent storage such as an object-oriented database, a relational database, and so forth.

In an example, data store 140 is associated with a well planning service. A well planning service may include systems, software applications and websites that allow users to create, modify, publish, distribute, and access various forms of well planning information. Thus, data store 140 may include well planning data, scenarios, simulations, graphics, etc.

Wellbore roadmap modeling system 120 may perform wellbore roadmap using one or more input parameters having numeric range data specified as input. For example, wellbore roadmap module 120 may assist users by automatically generating wellbore roadmap results based on numeric range data provided for various input parameters of a computational model. Thus, wellbore roadmap modeling system 120 may use numeric range data specified for input parameters to automate various manual and tedious steps that would otherwise be required when performing wellbore roadmap.

For example, wellbore roadmap modeling system 120 may receive a user-provided numeric range for an input parameter, automatically select multiple values from the numeric range to use when performing wellbore roadmap, calculate different computational model results for each of the selected values, generate graphical results to provide wellbore roadmap for the input parameter, and present the graphical results to a user.

In an example, a computational model generally refers to a mathematical model that is used to analyze and predict the behavior of a complex system through computer simulation. Examples of computational models include, but are not limited to, well engineering models, well planning and control models, hydrocarbon reservoir models, weather forecasting models, crime prediction models, etc. Range-based wellbore roadmap may be applied to computational models of any discipline and is not limited to the examples presented in this disclosure.

Figure 2:
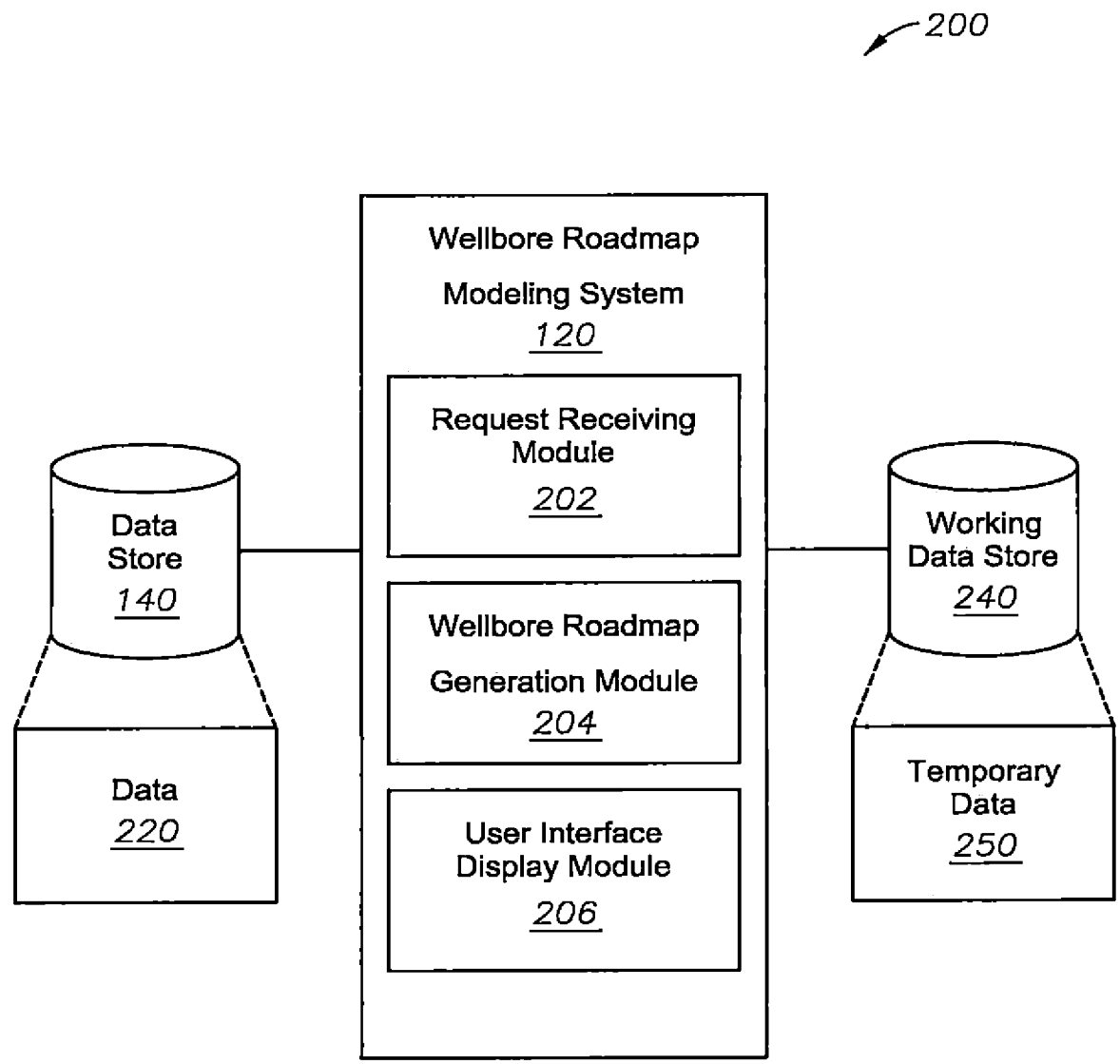
FIG. 2 is a block diagram illustrating a wellbore roadmap modeling system, in accordance with an embodiment.

FIG. 2 is a block diagram illustrating a wellbore roadmap modeling system 120, in accordance with an embodiment. Wellbore roadmap modeling system 120 includes request receiving module 202, wellbore roadmap generation module 204, and user interface display module 206. In other embodiments, functionality associated with one or more of request receiving module 202, wellbore roadmap generation module 204 and user interface display module 206 may be combined, divided and organized in various arrangements. In an embodiment, wellbore roadmap modeling system 120 is coupled to data store 140 and working data store 240. Data store 140 includes data 220. Working data store 240 includes temporary data 250.

In an embodiment, data 220 may include various forms of textual, audio, video, map, geodetic, spatial, and image content, as well as modeling equations and functions (for purposes of the disclosure, generally referred to herein as "computational model calculations") used by a wellbore roadmap modeling system 120. For example, with respect to drilling and extraction of hydrocarbons, such data may include formation porosity and permeability, formation pressure, formation stratification, drilling mud weights, drilling mud viscosity, etc. Likewise, such computational model calculations may represent various characteristics of a well to be modeled, such as the non-limiting example of well parameters as a function of depth. In this regard, data 220 may be data acquired from sensors or other equipment and uniquely associated with a particular reservoir or drilling system, or data 220 may be generally representative of a reservoir or drilling system.

Wellbore roadmap modeling system 120 may use working data store 240 as a temporary storage space for temporary data 250 associated with intermediate calculations and other operations associated with wellbore roadmap modeling system 220. Working data store 240 may include, for example, any type or combination of volatile and non-volatile storage (e.g., disk, memory).

Request receiving module 202 receives a first set of values for input parameters of a computational model. The first set of input parameter values may be received as part of a user generated or automated request to generate a wellbore roadmap. In one example, a user specifies a plurality of depth intervals representing a modeled well. The user may specify the numeric range for depth intervals or the number of intervals and length of intervals for a wellbore of a defined length, for example, in an input field of a graphical user interface or textually on a command line interface. The wellbore length, and interval range or number of intervals, then may be submitted as one of many inputs to a computational model. User interface display module 206 may then graphically display a generated wellbore with the intervals characterized or otherwise highlighted. Persons of skill in the art will appreciate that in certain embodiments, "depth" as used herein refers to axial distance of the wellbore from the surface, as opposed to simply a vertical distance from the surface, such that a particular depth interval may extend along a horizontal or non-vertical portion of a wellbore.

Request receiving module 202 also receives a set of computational model calculations to be associated with each interval. A list of computational model calculations may be presented for the user to select from, or alternatively, a set of computational model calculations may be automatically selected based on the particular depth of the interval and predetermined criteria associated with the particular depth. For example, at a first interval, a first set of modeling equations, functions and calculations may be most significant to modeling of the well at the first interval, while at a second interval, a second set of modeling equations, functions and calculations may be more significant to modeling of the well. As an example, at a first shallow interval, the kick off point of the directional trajectory may be the focus of the modeling because one might be using different string components and drilling parameters to drill this section of the hole, while at a deeper interval, mud column weight becomes more significant and may be the focus of the modeling.

Finally, request receiving module 202 receives values for a second set of input parameters of a computational model. The second set of input parameter values may be received as part of a user generated or automated request to generate a wellbore roadmap. In certain embodiments, a specific value is provided for one or more input parameters in the second set. In other embodiments, a numeric range defined as a minimum value and a maximum value is provided for one or more input parameters in the second set. Alternatively, the second set of input parameters may include some specific values and some ranges. The second set of input parameters represent the values utilized in the computational model calculations. Non-limiting examples of the second set of input parameters include weight on bit, rate of penetration, rotary speed, and mud weight.

Figure 3:
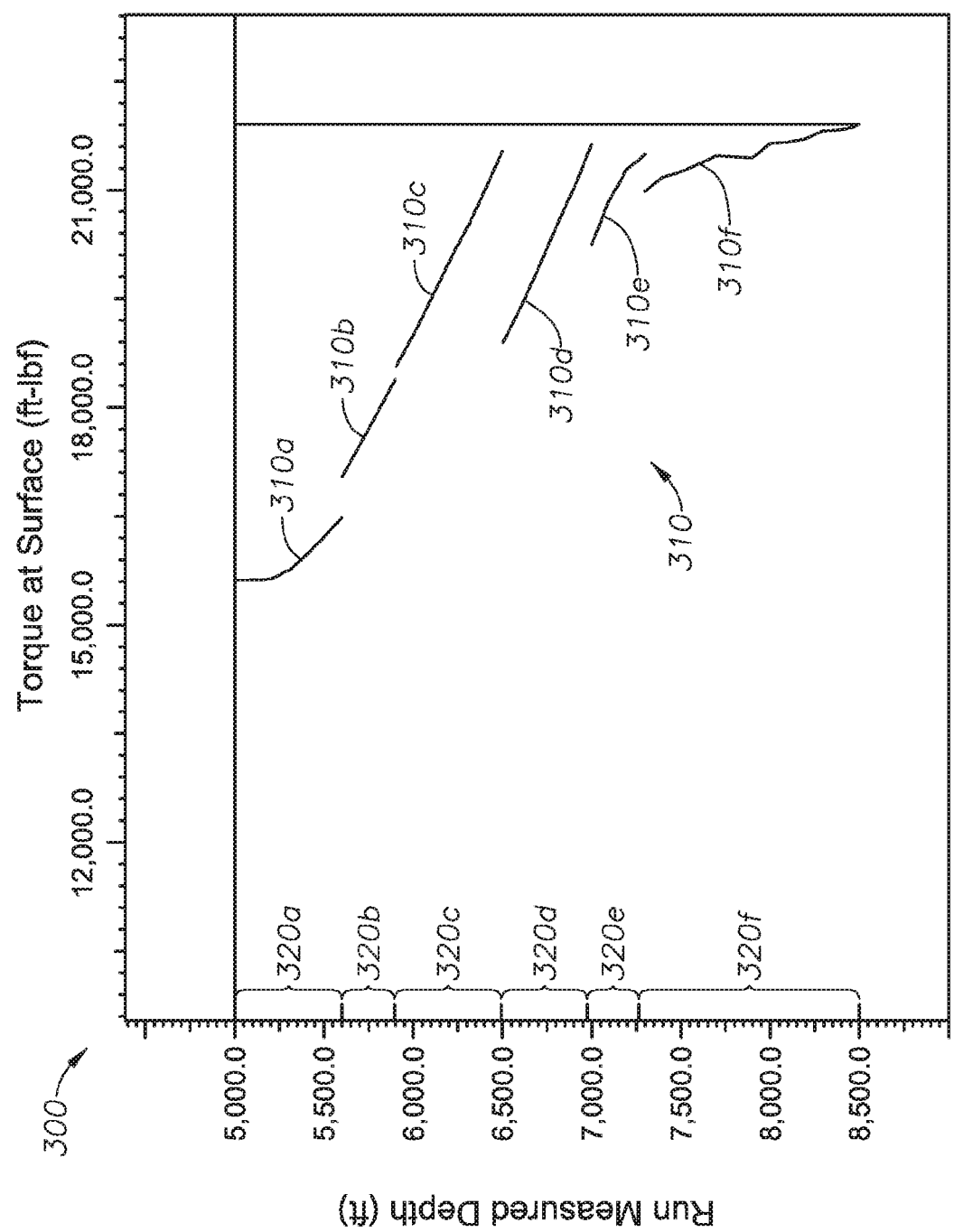
FIG. 3 is a wellbore roadmap illustrating torque at surface as a function of depth.
Figure 4:
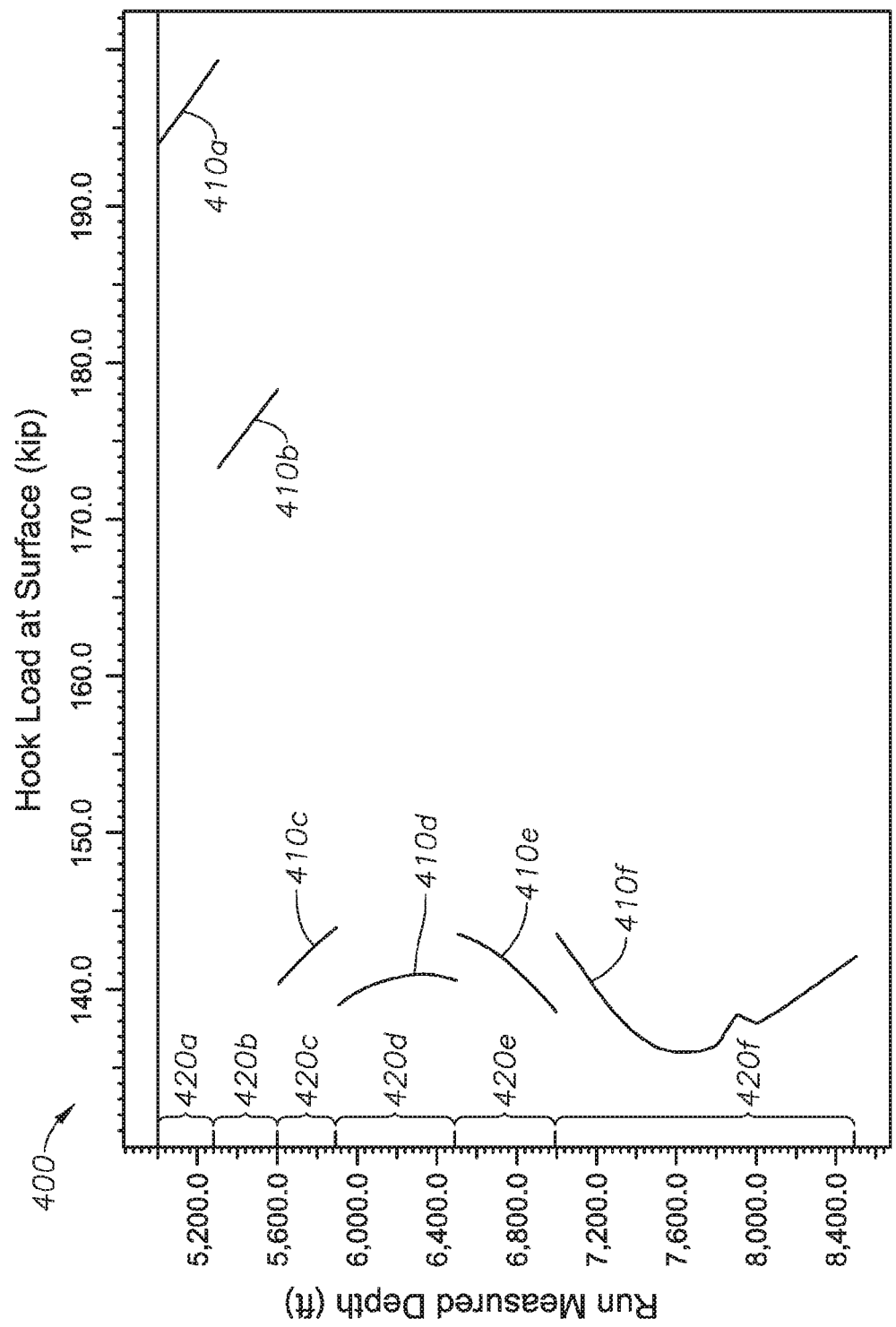
FIG. 4 is wellbore roadmap illustrating hook load at surface as a function of depth.

Once received, the second set of input parameter values are then utilized in the computational model calculations for each depth interval and a graphical interval plot is generated for each depth interval, as is illustrated in FIGS. 3 and 4.

Turning to FIG. 3, a graphical output 300 presenting a plurality of disparate interval plots 310 is illustrated and is generally referred to as a "wellbore roadmap." Wellbore roadmap as used herein refers to a graphical representation for any particular characteristic of a wellbore as a function of depth. For example, a wellbore roadmap may be illustrated as a hook load as a function of depth; torque load as a function of depth; weight on bit as a function of depth; mud weight as a function of depth, etc. In FIG. 3, specifically, the calculated torque at surface as a function of depth is shown for a plurality of individual depth intervals. To generate graphical output 300, six individual intervals 320a-320f have been defined and computational model calculations performed for each interval. The results are plots 310a-310f, correspondingly associated with intervals 320a-320f. Persons of ordinary skill in the art will appreciate from the disparate individual intervals that attempts to curve fit a single plot along the entire length of the modeled wellbore could yield a curve that differs significantly from actual torque at certain depths. For example, in the illustration, a curve fit would likely result in a curve where the torque at surface between 6,000 ft. and 7,000 ft. is inaccurately skewed downward at between 6,000 ft. and 6,500 ft. and is inaccurately skewed upward between 6,500 ft. and 7,000 ft. Rather, by calculating interval plots 310, a much more accurate representation of the torque at surface for a particular depth can be presented.

In FIG. 4, a graphical output 400 presenting a plurality of disparate interval plots 410 is illustrated. Specifically, the calculated hook load at surface for individual depth intervals is shown. To generate graphical output 400, six individual intervals 420a-420f have been defined and computational model calculations performed for each interval. The results are plots 410a-410f, correspondingly associated with intervals 420a-420f. Again, persons of ordinary skill in the art will appreciate from the disparate individual intervals that attempts to curve fit a single plot along the entire length of the modeled wellbore could yield a curve that differs significantly from actual hook loads at certain depths. For example, in the illustration, a curve fit would likely result in a curve where the hook load at surface between 5,200 ft and 6,400 ft is inaccurately skewed upward. Rather, by calculating interval plots 410, a much more accurate representation of the torque at surface for a particular depth can be presented.

Figure 5:
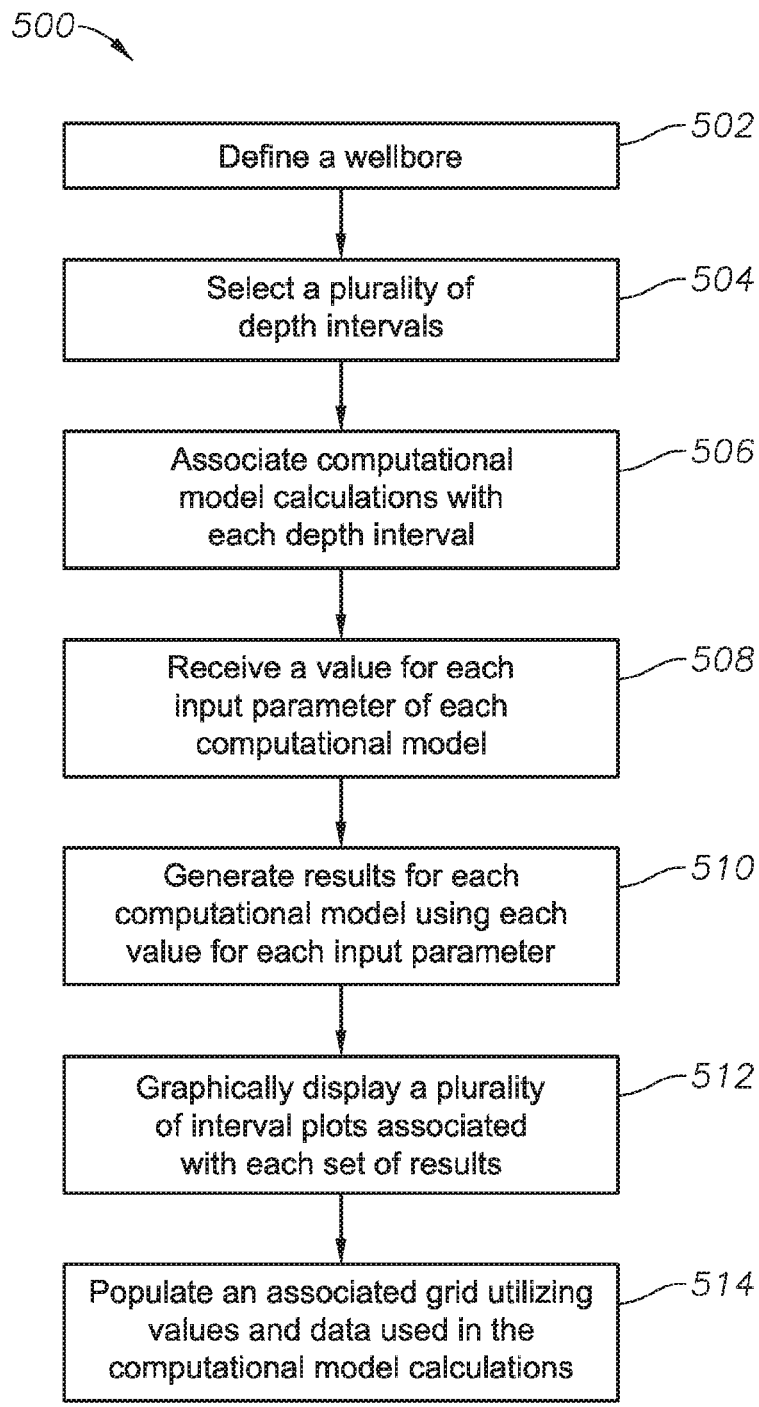
FIG. 5 is a flow diagram illustrating wellbore roadmap modeling, according to an embodiment.

FIG. 5 is a flow diagram illustrating a wellbore roadmap modeling system, according to an embodiment. Method 500 is performed by processing logic that may comprise hardware (circuitry, dedicated logic, etc.), software (such as is run on a general purpose computer system or a dedicated machine), or a combination of both. In one embodiment, method 500 is performed by server machine 110 of FIG. 1.

Method 500 may be performed by wellbore roadmap modeling system 120 running on server machine 110 or one or more other computing devices.

Method 500 begins at step 502, where a wellbore, or a portion of a wellbore, in a formation is defined. In this step, a wellbore may generally be modeled in a formation. The modeled wellbore may be graphically illustrated, such as shown as wellbore 610 in FIG. 6, and preferably illustrates the directional profile of the wellbore in the formation. In this regard, the wellbore is defined along an axial length, which may include horizontal and/or vertical portions. Moreover, while generally referred to herein as a wellbore, the modeled portion may be a branch off of a main wellbore.

Figure 6:
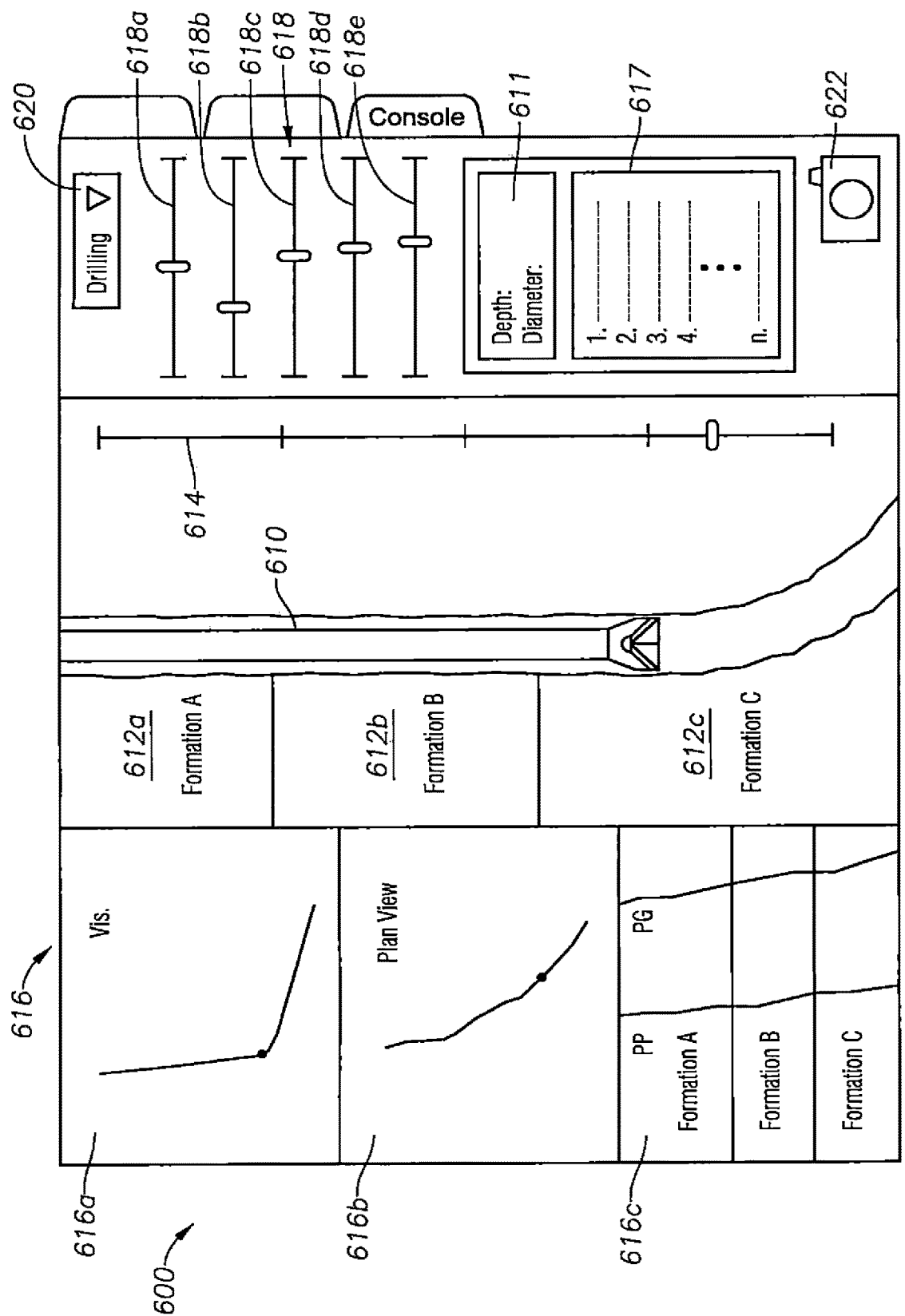
FIG. 6 illustrates a user interface for generating a wellbore roadmap in a well planning application, according to an embodiment.

In step 504, a plurality of depth intervals for the modeled wellbore is defined. The depth intervals may be selected by a user or computer defined. As used herein, depth interval refers to an axial length or segment of the wellbore representing a portion of the overall axial length of a larger length of the wellbore, or alternatively, the entire length of the wellbore. FIG. 6 illustrates individual depth intervals 612a, 612b and 612c.

Figure 7:
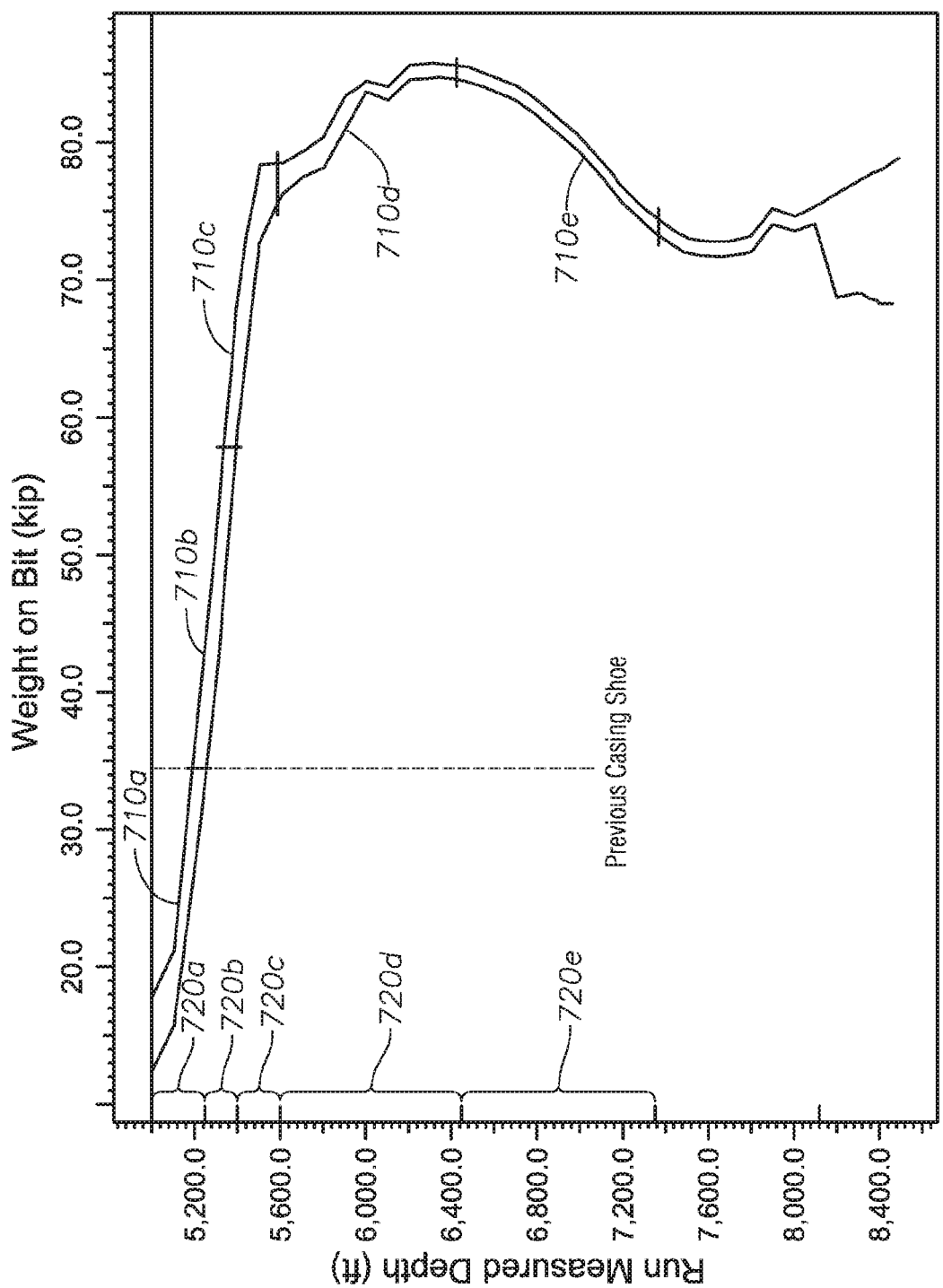
FIG. 7 is a graph of a wellbore characteristic as a function of depth illustrating the selection of depth intervals in the wellbore roadmap modeling system, according to an embodiment.

With respect to step 504, in certain embodiments, the intervals may be selected based on preliminary computational model calculations. The preliminary model calculations may be used to determine a particular characteristic of the wellbore environment (which may include the formation, the wellbore itself, a drill string or other equipment disposed n the wellbore or other materials, such as drilling mud, cuttings or hydrocarbons in the wellbore) as a function of depth. For example, weight on bit of the drill string may be determined as a function of depth. Intervals may then be selected each time there is a significant change in the characteristic as a function of depth. FIG. 7 illustrates this step in operation. In this case, weight on bit is determined as a function of depth. Thereafter, intervals may be selected based on changes in the weight on bit as depth increases. In the illustration, a segment of a wellbore extends from approximately 5000 ft. to approximately 8400 ft. The weight on bit as a function of depth is presented by line 710. Line 710 may then be divided into segments as desired, such as segments 710a-710e. For example, as shown, there is a significant decrease in the change in weight on bit at approximately 5,000 ft. Thus, this change would be an appropriate spot to separate segments and depth intervals. In this case, segments 710c and 710d are defined at the change, which segments then correspond to depth intervals 720c and 720d. As shown, depth interval 720d is significantly larger than depth interval 720c because the change in weight on bit across depth interval 720d is comparatively small. In this same vein, for each of segments 710a-710c, the change in weight on bit between segments is comparatively large. Thus, in this case, the related depth intervals 720a-720c are comparatively small. In this way, segments 710a-710e may be used to define depth intervals. Alternatively, a user or computer may simply define intervals based on the degree of change in a particular characteristic. Thus, for example, in FIG. 7, any change in the weight on bit of more than 10 kip may result in a separate depth interval being defined.

Turning back to FIG. 5, in step 506, computational model calculations are selected for each interval. The computational models have one or more variable parameters. In one preferred embodiment, a user selects a set of computational model calculations from a larger group of computational model calculations, such as all of the computational model calculations that might be used to model a wellbore pipe string related operation. The selected set is associated with a particular interval. Between intervals, sets of computational model calculations may be the same or differ. In certain cases, it may be that a first set of computation model calculations are most important for a first portion of the wellbore while a second set of computational model calculations are most important for a second portion of the wellbore. Thus, the set of computational model calculations for each depth interval may be the same or differ. Alternatively, the computer can automatically assign a set of computational model calculations to each determined depth interval based on predetermined criteria, such as the type of operation performed at the specific intervals (sliding, rotating, tripping in and out, cementing, etc.).

At step 508, a numeric value or range of values is received for each input parameter of a computational model. The values are proved for each set of computational model calculations associated with an interval. In an embodiment, a computational model includes one or more different input parameters, each of which may accept a single value or a numeric range. In one embodiment, a numeric values are received from input fields in a well planning software application. This data may be provided via a table or chart, or via a graphical user interface ("GUI") utilized for data input. In another embodiment, numeric values are received from data store 140 or from other external source of data.

In an embodiment, one or more input fields are provided on a user interface. In an example, some input fields accept only one type of input such as either a numeric range or individual numeric values. In another example, flexible input fields may accept one or more different types of input. For example, one type of flexible input field may accept either a specific numeric value or a defined numeric range at one time. Another type of flexible input field may accept either a specific text value or a defined numeric range at one time.

At step 510, computational model calculation results are generated for a depth interval utilizing the input parameters as the values for the computational model calculations associated with the particular depth interval. Step 510 is repeated for each depth interval using the associated computational model calculations and numeric values for the input parameters. If a range of values is provided for an input parameter, the computational model calculations may be executed multiple times. Step 510 may be performed by, for example, wellbore roadmap generation module 204.

At step 512, the results of the computational model calculations for an interval plot are graphically displayed, such as is illustrated in FIGS. 3 and 4. To the extent all of the sets of computational model calculations have been executed, an interval plot for each of the sets of computational model calculations are displayed. To the extent any set of computational model calculations includes a value range as the input parameters, multiple interval plots for a select depth interval may be displayed. In any event, while each interval plot may be separated displayed graphically, it is most desirable to collectively display all of the interval plots together. Step 512 may be performed by, for example, wellbore roadmap generation module 204.

In some embodiments, step 514 may be performed, wherein a grid utilizing the selected input parameters associated with an interval plot is populated. Numerical version of the results also may be provided alone or together with corresponding graphics. In one example, the results may be stored in a database for subsequent access. More particularly, each selected value for an input parameter that is used to generate an interval plot is provided in a control list. In an example, listed values are associated with at least one corresponding portion of the graphical output. In one example, displayed results are adjusted to visually indicate the interval plot corresponding to a selected value in the control list based on a user interaction with the value. For example, an interval plot, i.e., a plotted line on a graphical output, may be highlighted, may change color, or may be shaded when a user clicks, hovers, or interacts with a corresponding value in the control list of selected values. Generally, each row in the control list of selected values represents a set of numerical values used as parameters when performing a specific set of computational model calculation. In other words, each row in the control list may represent a different depth interval on the graphical output.

In another example, a value in the control list of selected values is adjusted when a corresponding area of the displayed results is involved in a user interaction. For example, a specific value in the control list of selected values may be highlighted, may change color, may be shaded, or may be adjusted (e.g., italicized, underlined, etc.) when a user clicks, hovers, or interacts with a corresponding area of the graphically displayed depth interval. Step 514 may be performed by, for example, by user interface display module 206.

FIG. 6 illustrates one embodiment of graphical user interface or GUI for generating a wellbore roadmap in a well planning application. User interface 600 includes a graphical illustration of a wellbore, as shown at 610. The particular position and orientation of graphical illustration 610 may vary depending on the orientation of the wellbore in a formation. While a vertical section of a wellbore is illustrated, the wellbore may be a horizontal wellbore or portion thereof. Alternatively a vertical depiction may be utilized to represent a horizontal portion. The graphical illustration 610 of a wellbore may further include relevant equipment 611 disposed in the modeled wellbore, such as the non-limited example of the depicted drill string.

User interface 600 also preferably includes a plurality of depth intervals 612 for the modeled wellbore. As described above, depth intervals 612 may be selected by a user or computer defined. As used herein, depth interval refers to an axial length or segment of the wellbore representing a portion of the overall axial length of a larger length of the wellbore, or alternatively, the entire length of the wellbore. FIG. 6 illustrates individual depth intervals 612a, 612b and 612c.

Persons of ordinary skill in the art will appreciate that interface 600 is generated upon the selection or determination of the wellbore parameters, i.e., length and depth intervals. Interface 600 may include data input blocks 611 for receiving one or more wellbore parameters. In this regard, generating interface 600 is an optional step that can be associated with steps 502-504 of the process illustrated in FIG. 5.

A graphically displayed depth slider 614 may also be depicted. Preferably depth slider 614 is arranged adjacent to the length of the graphical illustration 610 of the wellbore. Associated with the depth slider 614 are one or more interim plots 616. Interim plots are graphical representations of particular parameters or characteristics associated with the wellbore at a select depth. Interim plots 616 may also graphically illustrate one or more plotted computational model calculations. As slider 614 is adjusted, different interim plots 616 for the particular depth represented by slider 614 may be displayed.

In the illustrated example, interim plot 616a illustrates a graphical representation of the overall directional profile of an entire wellbore with an indicator 618 corresponding to graphical illustration of a wellbore section displayed at 610. Interim plot 616b is a plan view of the same directional profile. Interim plot 616c is a representation of the pore pressure and fracture gradient profiles of different formations to be drilled. Persons of ordinary skill in the art will appreciate that the disclosure is not limited by the number or type of interim plots 616 displayed. Rather, interim plots may be defined or otherwise selected by the user as desired.

User interface 600 may also include a listing of computational model calculations, such as at 617. The list may represent a larger grouping of computational model calculations from which a user may choose a set to associate with a specified depth (which may be specified by slider 614), or the list may simply represent the set of computational model calculations associated with a depth (previously determined). In this regard, one or more listed computational model calculations 617(1) . . . 617(n) may be linked to the interim plots 616, such that an interim plot graphically illustrates a particularly listed computational calculation across a particular variable range.

User interface 600 may also include one or more sliders 618 corresponding to input parameters associated with the computational model calculations for a particular depth or depth interval. As slider 614 is adjusted, different input parameter sliders 618 corresponding with the input parameters associated with a particular depth interval set of computational model calculations may be displayed.

Preferably a slider 618 is provided for each computational model calculation within a set for which a variable may be adjusted. For example, if a set of computational model calculations required a numeric value input for five different input parameters, then five different input parameter sliders 618a-618e would be displayed. Each slider 618 can be moved through a range for a particular input parameter. The range may be manually entered by the user or may be selected by using the slider 614, the same will move in synchronization with the other depth based plots. As an input slider 618 is adjusted, corresponding changes in one or more interim plots 616 will be depicted, thereby permitting a user to readily visualize the effects of a change in one or more values of input parameters. In some embodiments, adjacent one or more sliders described herein (depth and input parameters), a numerical value representing the position of the slider may be displayed.

Optionally, a wellbore operation selector 620 may be provided. Wellbore operation selector 620 allows a user to select the particular operation being carried out in the modeled wellbore. For example, a drill string may be rotating or sliding; or equipment may be tripped in or tripped out of the wellbore; or production equipment may be installed and operating in the wellbore. Persons of skill in the art will appreciate that the wellbore operation will drive the modeling of the wellbore and therefore the computational model calculations that might be utilized in the modeling.

Finally, interface 600 includes an icon 622 that allows a user to select a particular set of input parameters to generate an interval plot. Specifically, once input parameter slider(s) 618 have been positioned as desired at a particular depth interval, activation of icon 622 generates an interval plot and corresponding entries in the associated control list.

Figure 8:
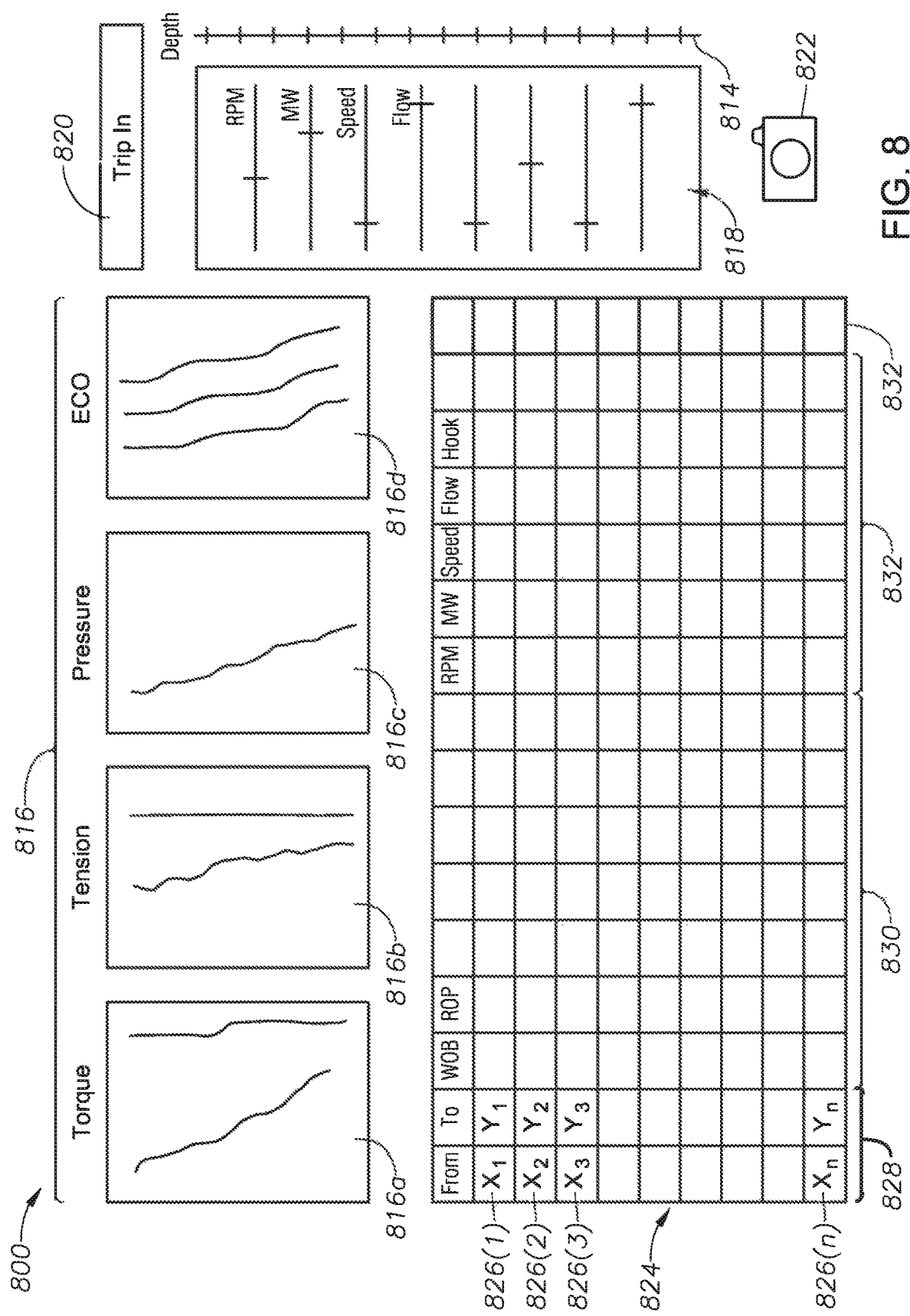
FIG. 8 illustrates a user interface for generating a wellbore roadmap in a well planning application, according to an embodiment.

FIG. 8 illustrates another embodiment of user interface for generating a wellbore roadmap in a well planning application. User interface 800 is similar to user interface 600, but without a graphical illustration of a wellbore. User interface 800 includes a graphically displayed depth slider 814, the range of which is driven by user or computer input to correspond to wellbore or portion thereof. Associated with the depth slider 814 are one or more interim plots 816.

Interim plots are graphical representations of particular parameters or characteristics associated with the wellbore at a select depth. As slider 814 is adjusted, different interim plots 816 for the particular depth represented by slider 814 may be displayed.

In the illustrated example, interim plot 816a illustrates a graphical representation of torque vs. run measured depth and the correspondent limits. Interim plot 816b illustrates a graphical representation of hook load (or surface weight) vs. run measured depth and the correspondent limits. Interim plot 816c is differences in pressure while moving or tripping the pipe string inside the wellbore vs. run measured depth. Interim plot 816d is ECD (Equivalent circulation density) vs. measured depth and the correspondent limits. Persons of ordinary skill in the art will appreciate that the disclosure is not limited by the number or type of interim plots 816 displayed. Rather, interim plots may be defined or otherwise selected by the user as desired.

User interface 800 may also include one or more sliders 818 corresponding to input parameters associated with the computational model calculations for a particular depth or depth interval. As depth slider 814 is adjusted, different input parameter sliders 818 corresponding with the input parameters associated with a particular depth interval set of computational model calculations may be displayed. Alternatively, sliders 818 may remain fixed across the depth intervals.

Preferably a slider 818 is provided for each computational model calculation within a set for which a variable may be adjusted. For example, if a set of computational model calculations required a numeric value input for five different input parameters, then five different input parameter sliders would be displayed. Each slider 818 can be moved through a range for a particular input parameter. The range may be manually entered by the user or may be selected by using the slider 614, the same will move in synchronization with the other depth based plots. As an input slider is adjusted, corresponding changes in one or more interim plots 816 will be depicted, thereby permitting a user to readily visualize the effects of a change in one or more values of input parameters.

Optionally, a wellbore operation selector 820 may be provided. Wellbore operation selector 820 allows a user to select the particular operation being carried out in the modeled wellbore. For example, a drill string may be rotating or sliding; or equipment may be tripped in or tripped out of the wellbore; or production equipment may be installed and operating in the wellbore. Persons of skill in the art will appreciate that the wellbore operation will drive the modeling of the wellbore and therefore the computational model calculations that might be utilized in the modeling.

Interface 800 includes an icon 822 that allows a user to select a particular set of input parameters to generate an interval plot. Specifically, once input parameter slider(s) 818 have been positioned as desired at a particular depth interval, activation of icon 822 generates an interval plot and corresponding entries in the associated control list.

Finally, interface 800 includes a control list 824 which displays data associated with each interval plot generated by wellbore roadmap generation module 204. Preferably, each time icon 822 is activated, a new row 826(1) . . . 826(n) is generated and displayed in control list 824 for a particular depth interval. As described above, the row 826 corresponds to a graphical interval plot, such as interval plots 310 is illustrated in FIG. 3. The row 826 preferably may include a definition of the depth interval, such as for example, the axial depth at the beginning and ending of the depth interval, such as is illustrated at 828. The row 826 preferably may include the output in one or more columns from the various computational model calculations associated with the depth interval, such as is illustrated at 830. In certain embodiments, selecting or otherwise highlighting a particular output will result in a pop-up display or similar presentation of the underlying details, i.e., intermediate calculations, input parameters, etc., used to generate the output. Alternatively, or in addition, row 826 preferably may include in one or more columns numeric value data 832 for any input parameters utilized in the various computational model calculations associated with the depth interval. Numeric value data 832 may include data 220 and may include values selected by sliders 818. Optionally, interface 800 may include a user selectable visual indicator 832 for one or more rows 826 to toggle between including (as active) or excluding (as inactive) a row 826 and the associated interval plot in a wellbore roadmap such as roadmaps 300 and 400 discussed above.

While user interface 600 has been described without a control list, such as control list 824, and user interface 800 has been described without a graphical illustration 610 of a wellbore, it will be appreciated that a user interface as described herein may include both of these elements. Moreover, with respect to interface 600, preferably a retrievable control list, such as control list 824, is generated even though it is not graphically presented on interface 600. As described above, once results for a set of computational model calculations are computed, an interval plot is generated and a control list 824 or grid is populated.

In general, the foregoing interfaces and wellbore roadmaps that result therefrom allow a user to much more readily and accurately model a wellbore at select depths while at the same time visualizing the most significant characteristics of the wellbore environment at that depth.

The foregoing embodiments presented herein are particularly useful when drilling wellbores in oil and gas reservoirs. In an embodiment, using the wellbore roadmap system described herein, an oil or gas reservoir is modeled when designing a well completion plan for a well. In one example, a well completion plan includes selecting a fracturing plan, which may include selecting fracture zones, fracture zone positioning, fracturing fluids, proppants and fracturing pressures. In some embodiments, a drilling well completion plan may include selecting a particular wellbore placement or wellbore trajectory or selecting a desired wellbore pressure to facilitate mass transfer and fluid flow to the wellbore. A drilling plan may be implemented based on a model by preparing equipment to drill the modeled wellbore, and a wellbore may be drilled in accordance with the plan. Thereafter, in one example, fracturing may be carried out in accordance with the model to enhance flow from the reservoir to the wellbore. In another example, wellbore pressure may be adjusted in accordance with the model to achieve a desired degree of mass transfer and fluid flow.

While embodiments of the present disclosure may be described statically as part of implementing a drilling plan, those of ordinary skill in the art will appreciate that such embodiments may also be implemented dynamically. For example, a drilling plan may be implemented using a first set of model data. Once drilling has commenced, the wellbore roadmap system may be updated utilizing actual measured values as input parameters, such as may be measured by sensors or other measurement equipment deployed or associated with a drilled wellbore. In another example, the methods, systems and computer program products described herein may be utilized during the drilling process, on the fly or iteratively, to calculate and re-calculate characteristics of the reservoir over a period of time as parameters change, are clarified, or are adjusted. Thus, in an example, results of dynamic calculations may be utilized to alter a previously implemented drilling plan. For example, such dynamic calculations may result in the utilization of a heavier or lighter fracturing fluids.

Figure 9:
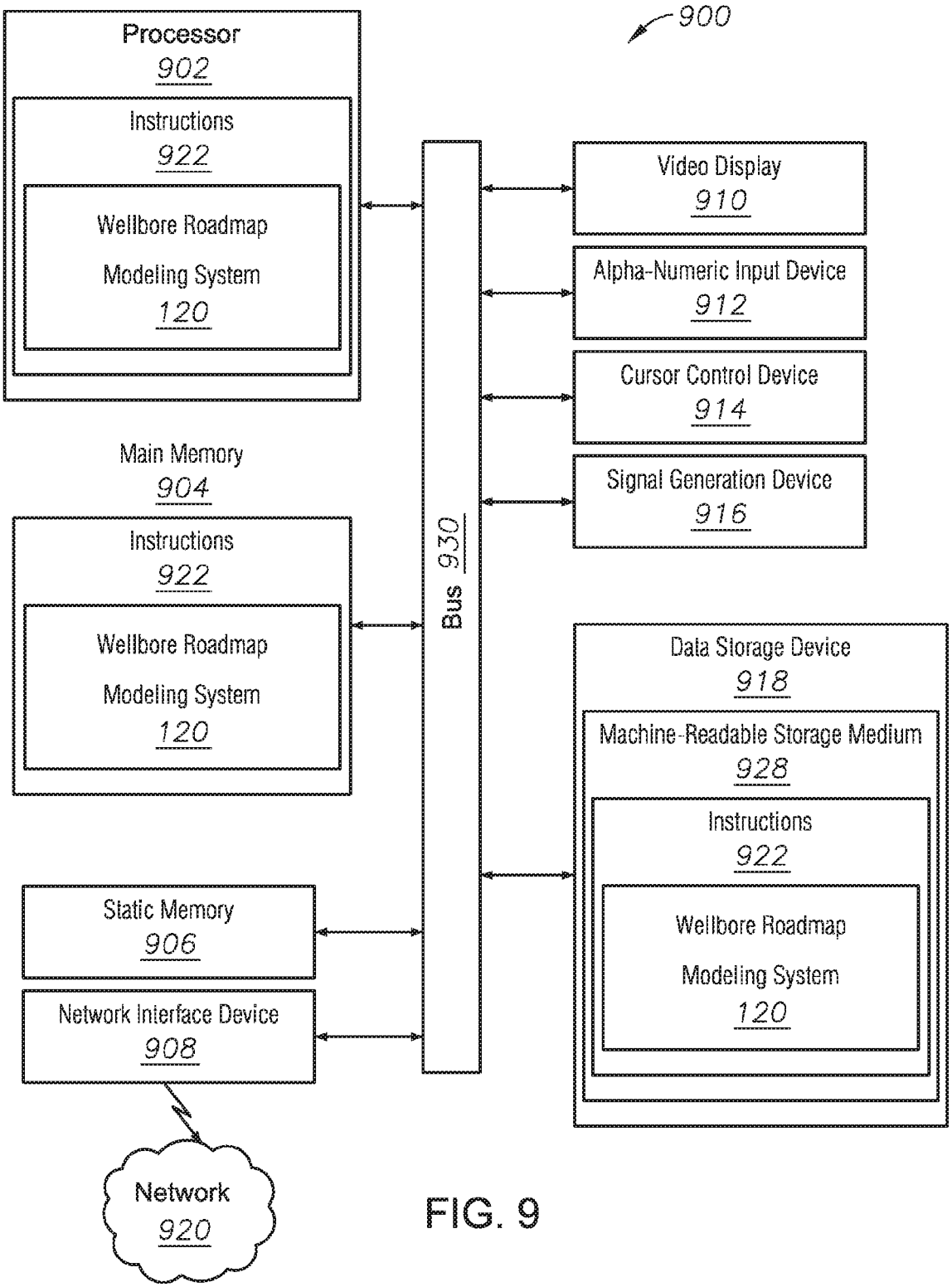
FIG. 9 is a block diagram of an exemplary computer system that may perform one or more of the operations described herein.

FIG. 9 illustrates a diagram of a machine in the exemplary form of a computer system 900 within which a set of instructions, for causing the machine to perform any one or more of the methodologies discussed herein, may be executed. In alternative embodiments, the machine may be connected (e.g., networked) to other machines in a LAN, an intranet, an extranet, or on the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 900 includes a processing device (processor) 902, a main memory 904 (e.g., read-only memory (ROM), flash memory, dynamic random access memory (DRAM) such as synchronous DRAM (SDRAM), double data rate (DDR SDRAM), or DRAM (RDRAM), etc.), a static memory 906 (e.g., flash memory, static random access memory (SRAM), etc.), and a data storage device 918, which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 902 may also be one or more special-purpose processing devices such as an application specific integrated circuit (ASIC), a field programmable gate array (FPGA), a digital signal processor (DSP), network processor, or the like. The processor 902 is configured to execute instructions 922 for performing the operations and steps discussed herein.

The computer system 900 may further include a network interface device 908. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), and a signal generation device 916 (e.g., a speaker).

The data storage device 918 may include a computer-readable storage medium 928 on which is stored one or more sets of instructions 922 (e.g., software) embodying any one or more of the methodologies or functions described herein. The instructions 922 may also reside, completely or at least partially, within the main memory 904 and/or within the processor 902 during execution thereof by the computer system 900, the main memory 904 and the processor 902, also constituting computer-readable storage media. The instructions 922 may further be transmitted or received over a network 920 via network interface device 908.

In one embodiment, the instructions 922 include instructions for a wellbore roadmap modeling system (e.g., wellbore roadmap modeling system 120 of FIG. 1) and/or a software library containing methods that call a wellbore roadmap modeling system. While the computer-readable storage medium 928 (machine-readable storage medium) is shown in an exemplary embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

In the foregoing description, numerous details are set forth. It will be apparent, however, to one of ordinary skill in the art having the benefit of this disclosure, that the present disclosure may be practiced without these specific details. In some instances, well-known structures and devices are shown in block diagram form, rather than in detail, in order to avoid obscuring the present disclosure.

Some portions of the detailed description have been presented in terms of algorithms and symbolic representations of operations on data bits within a computer memory. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "receiving", "computing", "comparing", "displaying", "adjusting," "applying," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Certain embodiments of the present disclosure also relate to an apparatus for performing the operations described herein. This apparatus may be constructed for the intended purposes, or it may comprise a general-purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

Although various embodiments and methodologies have been shown and described, the present disclosure is not limited to such embodiments and methodologies and will be understood to include all modifications and variations as would be apparent to one skilled in the art. Therefore, it should be understood that this disclosure is not intended to be limited to the particular forms disclosed. Rather, the intention is to cover all modifications, equivalents and alternatives falling within the spirit and scope of the disclosure as defined by the appended claims.

What is claimed is:

1. A computer-implemented method, comprising:
   receiving, by a processor, a plurality of depth intervals representing a modeled wellbore;
   for each depth interval:
      selecting a set of input parameters for a computational model;
      receiving, by a processor, values for each input parameter in the set of input parameters selected for the computational model;
      computing, by the processor, computational model results by using the values received for each of the input parameters in different computational model calculations; and
      populating a grid utilizing the selected input parameter values in association with an interval plot representing the computational model results for the depth interval;
   displaying, by the processor, a roadmap for the modeled wellbore as a single plot including the interval plot for each depth interval, based on the corresponding input parameter values populated in the grid;
   displaying the grid as a list of interval plots including the interval plot and the selected input parameters for each depth interval;
   drilling a portion of an actual wellbore corresponding to a first depth interval of the plurality of depth intervals;
   acquiring, by the processor from one or more sensors, measured values of the selected input parameters for the first depth interval; and
   updating a corresponding portion of the displayed roadmap for the modeled wellbore based on the acquired measured values for the first depth interval.

2. The computer-implemented method of claim 1, further comprising:
   for each input parameter of the computational model, selecting a numeric range defined as a minimum value and a maximum value;
   selecting a plurality of values in each numeric range to use as the input parameter values in the different computational model calculations;
   for the plurality of values in the numeric range for each input parameter, computing the computational model calculations; and
   populating the grid with the selected input parameter values associated with the interval plot for each depth interval.

3. The computer-implemented method of claim 2, further comprising: graphically displaying a parameter slider for selecting the numeric range for each input parameter adjacent to the interval plot for at least one depth interval; and responsive to receiving, via a user interface, input for adjusting the slider within the numeric range, dynamically altering the adjacent interval plot in accordance with the received input.

4. The computer-implemented method of claim 3, wherein the parameter slider is displayed for a plurality of input parameters.

5. The computer-implemented method of claim 3, further comprising: utilizing the slider to select a value as the input parameter value for at least one computational model calculation.

6. The computer-implemented method of claim 3, further comprising:
for a select depth interval, displaying a plurality of interim plots associated with the computational model calculations;
responsive to receiving input for adjusting the parameter slider within the numeric range, dynamically altering the plurality of interim plots; and
utilizing the parameter slider to select a value as the input parameter value for at least one computational model calculation.

7. The computer-implemented method of claim 6, further comprising:
displaying a directional depth profile for the modeled wellbore adjacent to the interim plots.

8. The computer-implemented method of claim 7, further comprising:
graphically displaying a depth slider adjacent to the directional depth profile; and
responsive to receiving input for adjusting the depth slider for at least a portion of the modeled wellbore, altering the plurality of interim plots and parameter sliders displayed adjacent to the directional depth profile.

9. The computer-implemented method of claim 1, wherein the computational model calculations are the same for each depth interval.

10. The computer-implemented method of claim 1, wherein a first depth interval has a first set of computational model calculations and a second depth interval has a second set of computational model calculations that is different from the first set.

11. The computer-implemented method of claim 1, further comprising:
selecting a preliminary set of computational model calculations and modeling a wellbore through at least a portion of the depth of the wellbore;
generating preliminary results from the preliminary set of computational model calculations as a function of depth for a modeled wellbore; and
utilizing the preliminary results to determine the plurality of depth intervals.

12. The computer-implemented method of claim 1, wherein an input field is displayed with a corresponding selectable option for each interval plot in the list of interval plots to allow a user to include at least one selected interval plot in the display of the single plot.

13. The computer-implemented method of claim 12, further comprising:
adjusting the displayed grid to visually alter the at least one selected interval plot on the corresponding portion of the single plot.

14. The computer-implemented method of claim 13, wherein the displayed grid is adjusted in response to receiving input from the user dragging a visually presented line representing the at least one selected interval plot.

15. The computer-implemented method of claim 12, further comprising:
responsive to receiving input from the user with respect to the selectable option corresponding to an interval plot, selecting the interval plot and visually highlighting an entry in the list of interval plots associated-with the selected interval plot.

16. The computer-implemented method of claim 1, further comprising: visually displaying an option for a user to select each interval plot in the list of interval plots, the selection of which causes a corresponding portion of the single plot to be displayed with the selected interval plot.

17. A system comprising:
a memory and a processor coupled with the memory to perform any of the methods in claims 1-16.

18. A non-transitory computer readable medium having instructions stored thereon that, when executed by a processor, cause the processor to perform any of the methods in claims 1-16.

19. A computer-implemented method for drilling a wellbore, comprising:
modeling, by a processor, a wellbore in a formation;
defining a plurality of depth intervals representing the modeled wellbore;
for each depth interval:
selecting a set of input parameters for a computational model;
selecting values for each input parameter selected for the computational model;
computing, by the processor, computational model results by using the values selected for each of the input parameters in different computational model calculations; and
populating a grid utilizing the selected input parameter values in association with an interval plot representing the computational model results for the depth interval;
displaying, by the processor, a roadmap for the modeled wellbore as a single plot including the interval plot for each depth interval, based on the corresponding input parameter values populated in the grid;
displaying the grid as a list of interval plots including the interval plot and the selected input parameters for each depth interval;
drilling a portion of the wellbore within the formation corresponding to a first depth interval of the plurality of depth intervals;
acquiring, by the processor from one or more sensors associated with the wellbore, measured values of the selected input parameters for the first depth interval; and
updating a corresponding portion of the displayed roadmap for the modeled wellbore based on the acquired measured values for the first depth interval.

20. A system comprising:
a memory and a processor coupled with the memory to perform the method in claim 19.

21. A non-transitory computer readable medium having instructions stored thereon that, when executed by a processor, cause the processor to perform the method in claim 19.

* * * * *